(12) United States Patent
Haque et al.

(10) Patent No.: US 6,731,000 B1
(45) Date of Patent: May 4, 2004

(54) FOLDED-FLEX BONDWIRE-LESS MULTICHIP POWER PACKAGE

(75) Inventors: Shatil Haque, Mohegan Lake, NY (US); Gert Bruning, Sleepy Hollow, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/294,011

(22) Filed: Nov. 12, 2002

(51) Int. Cl.[7] .................................... H01L 23/04
(52) U.S. Cl. .................. 257/730; 257/776; 257/701; 438/125
(58) Field of Search ................. 257/701, 685, 257/730, 776, 691, 723, 724, 686; 438/110, 125

(56) References Cited

U.S. PATENT DOCUMENTS

| | | | | |
|---|---|---|---|---|
| 6,121,676 A | * | 9/2000 | Solberg | |
| 6,300,679 B1 | * | 10/2001 | Mukerji et al. | |
| 6,469,377 B1 | * | 10/2002 | Kondo et al. | |
| 6,486,544 B1 | * | 11/2002 | Hashimoto | |
| 6,590,282 B1 | * | 7/2003 | Wang et al. | |

* cited by examiner

Primary Examiner—S. V. Clark
(74) Attorney, Agent, or Firm—Frank Keegan

(57) ABSTRACT

A multichip wirebond-less integrated circuit and power die package is based on a folded single-layer flex circuit. The package is formed with metal-studbumped power dies and IC's flipchiped to a patterned flex substrate. Extensions of the flex substrate are folded and attached to the backside of the dies for electrical and/or thermal contact. I/O pins are along the periphery of the package for standard SMT mounting while heatspreaders are attached to both sides of the package for double-sided cooling.

19 Claims, 6 Drawing Sheets

BALL A.1 IDENTIFIER AS SEEN FROM BOTTOM OF PACKAGE

FOLDED-FLEX BONDWIRE-LESS MULTICHIP POWER PACKAGE

FIELD OF THE INVENTION

The present invention relates to an integrated power module, in particular to a folded flex bondwire-less multichip power package for high power densities.

BACKGROUND OF THE INVENTION

Applications demanding high-power conversion such as voltage regulators for microprocessors, automotive electronics and telecommunications have introduced a trend to achieve higher power densities at lower cost. Consequently, to meet future power density requirements, integrated power module solutions rather than traditional discrete solutions are required. Integration of power electronics components (e.g. devices, IC's, passives etc.) in a module format is, however, complicated by the presence in the module of a wide variety of materials.

Only recently, two commercial state-of-the-art multichip power packages for DC-DC power conversion have emerged, offering an integrated system solution.

A first kind of commercial package for voltage regulator applications involves a packaging architecture using ball grid array (BGA) technology. In a small footprint area of 11 mm×11 mm, a module using BGA technology houses, for example, two metal oxide semiconductor field-effect transistors (MOSFET's), a driver chip and a few passive components on a multilayer printed circuit board (PCB) substrate. FIG. 1A is a partial cross section of a package 101 of this kind, which includes a MOSFET 102 and a passive component 103 on a multilayer PCB 104. Inside the package 101, interconnections to the MOSFET 102 are made with wirebonds 105, and copper traces 106 are connected to BGA solder bumps 107 on the back of the package 101 for board attachment. The connection to the BGA solder bumps 107 is by way of copper layers of the multilayer PCB 104. Molding compound 108 fills the package 101. The package thickness is 3 mm or greater.

A second commercial multichip package contains MOSFET's and an IC within an area of 10 mm×10 mm, providing an integrated solution for voltage regulators for microprocessors. The package is based on a design, which uses a leadframe etched into a substrate, such as the MicroLeadFrame™ (MLF) technology of Amkor Technology, Inc. of West Chester, Pa. FIG. 1B is a view of a package 109 using MLF technology, which includes a copper leadframe 116 on which a die 111, attached with a die attachment material 112 to an exposed die paddle 113, is mounted. Device interconnections inside the package are achieved with wirebonds 114, 115. The contacts (not shown) on the copper leadframe 116 are brought straight down to a PCB on which the package 109 is mounted. Molding compound 117 fills the package 109. The thickness of the package is 0.9 mm or more.

Power MOSFET dies contain three terminals (gate, source and drain) and thus only require a few terminal connections at the package level. Multichip solutions, however, such as those of FIG. 1A and FIG. 1B use, respectively, standard IC packages such as 132-solder bump BGA and 68-lead MLF. A 68-lead MLF pin connection and board layout design for the second type of commercial package is shown in FIG. 2A. In FIG. 2A the MLF package 201 comprises a split leadframe 202 and MLF pins 203. In FIG. 2B a solder bump BGA package 204 has array of BGA solder balls 205.

As can be seen, in particular, from FIGS 2A and 2B, these standard IC packages for power devices lead to a significant number of connection redundancies. Moreover, these designs have reached the limit of pitch requirement for board layout. For example, the lead connections for the commercial package using MLF technology require a pitch of 0.5 mm, which would be impossible to pattern on any copper plane thicker than 2 oz. Furthermore, complex lead connections and tight pitch requirements of these packages also complicate the thermal via design on the board, which is essential for proper thermal management.

Both presently available commercial packages use multiple wirebonds per device and IC interconnections to reduce the effects of high resistance of the wirebonds. Adding more parallel wires to reduce electrical resistance ultimately, however, reaches a limit (2–3 mΩ) and the process becomes significantly expensive.

There are then several areas for improvement over the design of the commercial packages now available. The structure of the module can be adapted to provide better thermal management. The module can be made thinner. More devices can be accommodated. The expense of providing multiple wire bonds to reduce electrical resistance can be reduced or avoided. Assembly of the package can be simplified if the number of pin connections or leads is reduced.

Hence, objects of the present invention are, among other things, improved heat transfer, decreased thickness of multichip power modules, allowing increased integration of functionalities within a power module package, eliminating wirebonds, allowing a design without leads, and simplifying I/O pin connections.

These and still further objects of the present invention will become apparent upon considering the following detailed description of the present invention.

SUMMARY OF THE INVENTION

Therefore, the present invention provides an electronic assembly or module which includes a multichip semiconductor package based on a folded single-layer flex circuit, without a leadframe. Flipchip studbumped semiconductor power dies and IC dies are attached to a patterned flex substrate; extensions of the flex substrate are folded and attached to the backside of the dies for electrical and thermal contact. The entire package is plastic molded and only the copper contact pads at the bottom of the flex substrate are exposed for standard surface mount attachment to any board.

A flipchip studbumped semiconductor die is one in which the die is electrically connected, through a conductive "bump" on the die surface, to a package carrier so that the package carrier provides connection from the die to the package exterior. The package carrier may, for example, be a substrate or leadframe.

In the present invention, the studbumps provide very short and low resistance paths (less than 1 mΩ) for the device interconnects. Moreover, package inductance of the devices with studbumps can be reduced to 0.1 nH compared to 1 nH for a wirebond. Hence, in high-frequency applications, the packages of the present invention generate significantly less noise than the state-of-the-art solutions.

The present invention significantly improves thermal management over that offered by the existing solutions. Devices in the package are attached to a continuous flex substrate. Unlike a split leadframe (shown in FIG. 2A for an MLF module), heat generated from an individual device mounted on a continuous flex substrate has a wider area for dissipation.

The present invention also allows double-sided cooling as a result of its three-dimensional package architecture. Power MOSFET's have drain connections on the backside of the dies. In conventional packaging approaches (e.g. BGA and MLF packages), the die is attached face-up on the substrate to allow for heat dissipation through the drain pads. Wirebonds used for attaching the source and gate pads (on the topside of the dies) provide only a limited channel to extract the heat from the die-topside. In an embodiment of the present invention, the devices are placed face down (flipchip) on the substrate with gold metal bumps on the source and gate, thus providing more immediate thermal dissipation paths to the board. The flex-substrate is also folded and attached to the drain contacts, thus adding another channel for heat dissipation to the substrate. Because of its three-dimensional construction, the package offers improved thermal dissipation from both sides of the devices in a very small board area. Heatspreaders may be attached to either or both sides of the package. At the same time, flipchip studbumps offer shorter interconnects, thus lowering resistance heating as well as parasitic noise compared to conventional wirebond packages.

The structure of the present invention with its flipchip-bumped devices provides a much thinner package for multichip power-modules than commercial packages now available. Thickness of a conventional power package is primarily dictated by the loop-height of the wirebond interconnections. Using flipchip-bumped devices and folded flex, the present invention can achieve a package profile of less than 0.6 mm, which is a significant improvement over the 3 mm for the package using BGA technology and the 0.9 mm thickness of the MLF packages.

The number of required pin connections for board attachment is also significantly reduced compared to the existing solutions.

Copper pads in the present invention can be thicker than 2 oz., making possible a larger pitch for the lead connections. Larger pads and pitch (1 mm or higher) allow easier SMT (surface mount technology) operations.

These and other aspects of the invention will be apparent from and elucidated with reference to the embodiment(s) described herein.

DESCRIPTION OF PREFERRED EMBODIMENTS

Figure 1A:
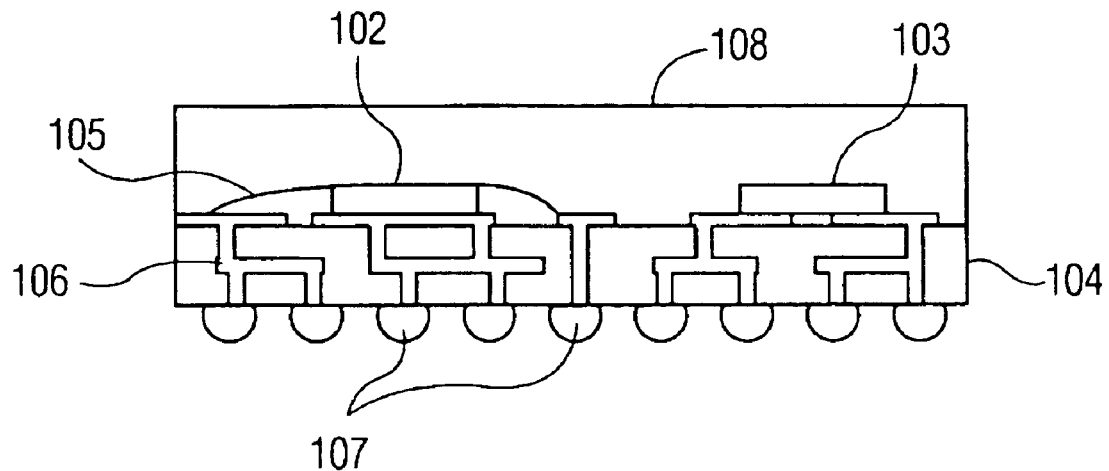
FIG. 1A shows a commercially available product using BGA technology.
Figure 1B:
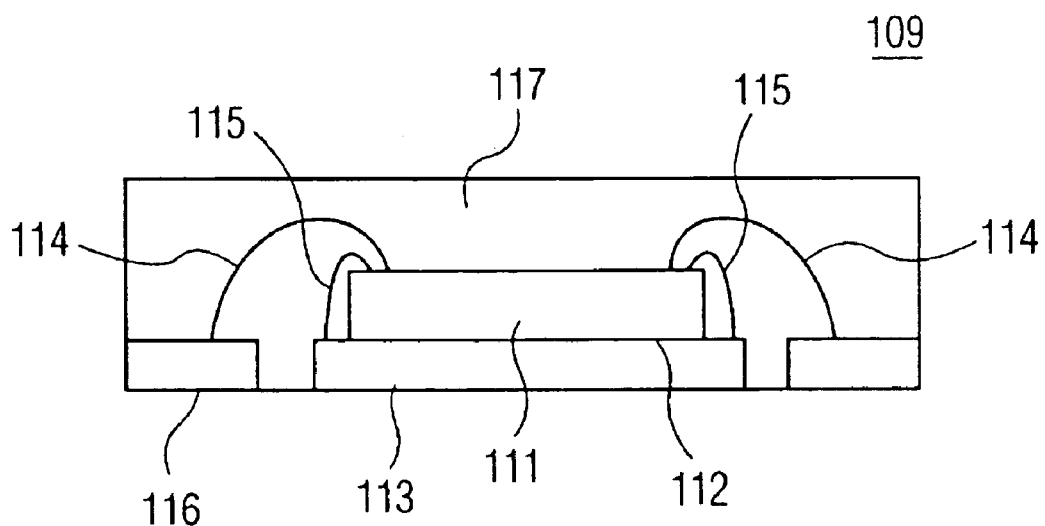
FIG. 1B shows a commercially available product using MLF technology.
Figure 2A:
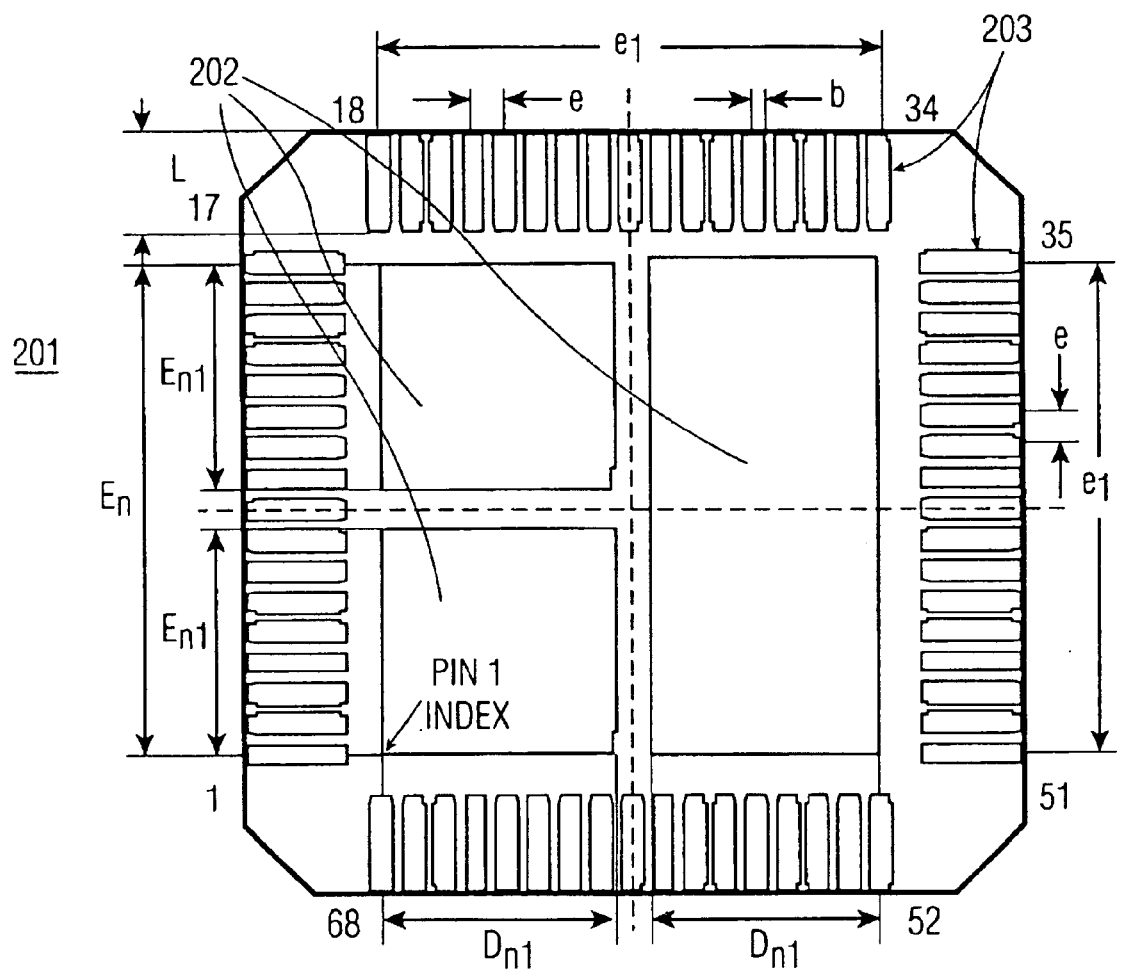
FIG. 2A shows pin connections/board layout designs for a commercially available MLF-based package.
Figure 2B:
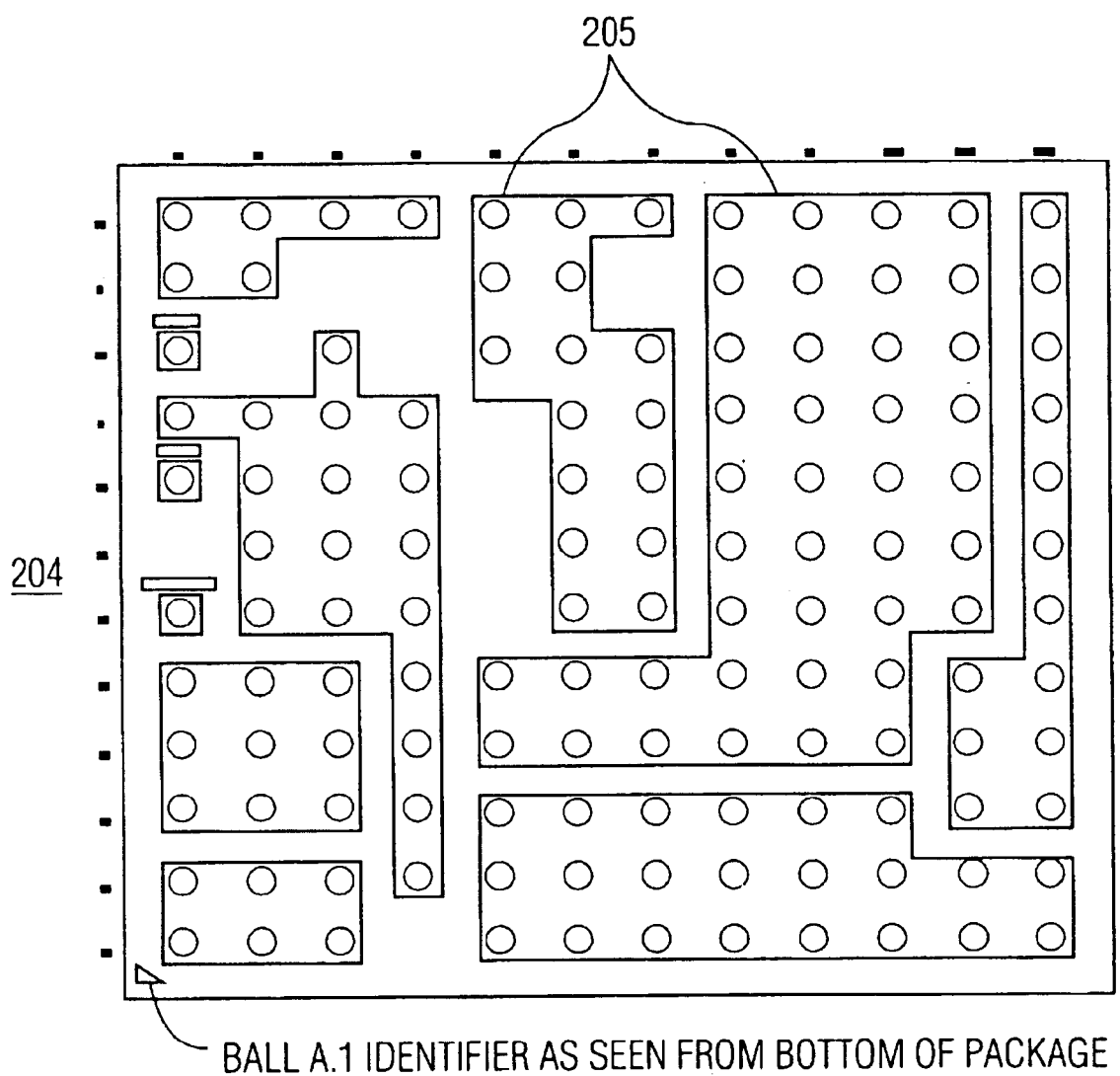
FIG. 2B shows pin connections/board layout designs for a commercially available BGA-based package.
Figure 3:
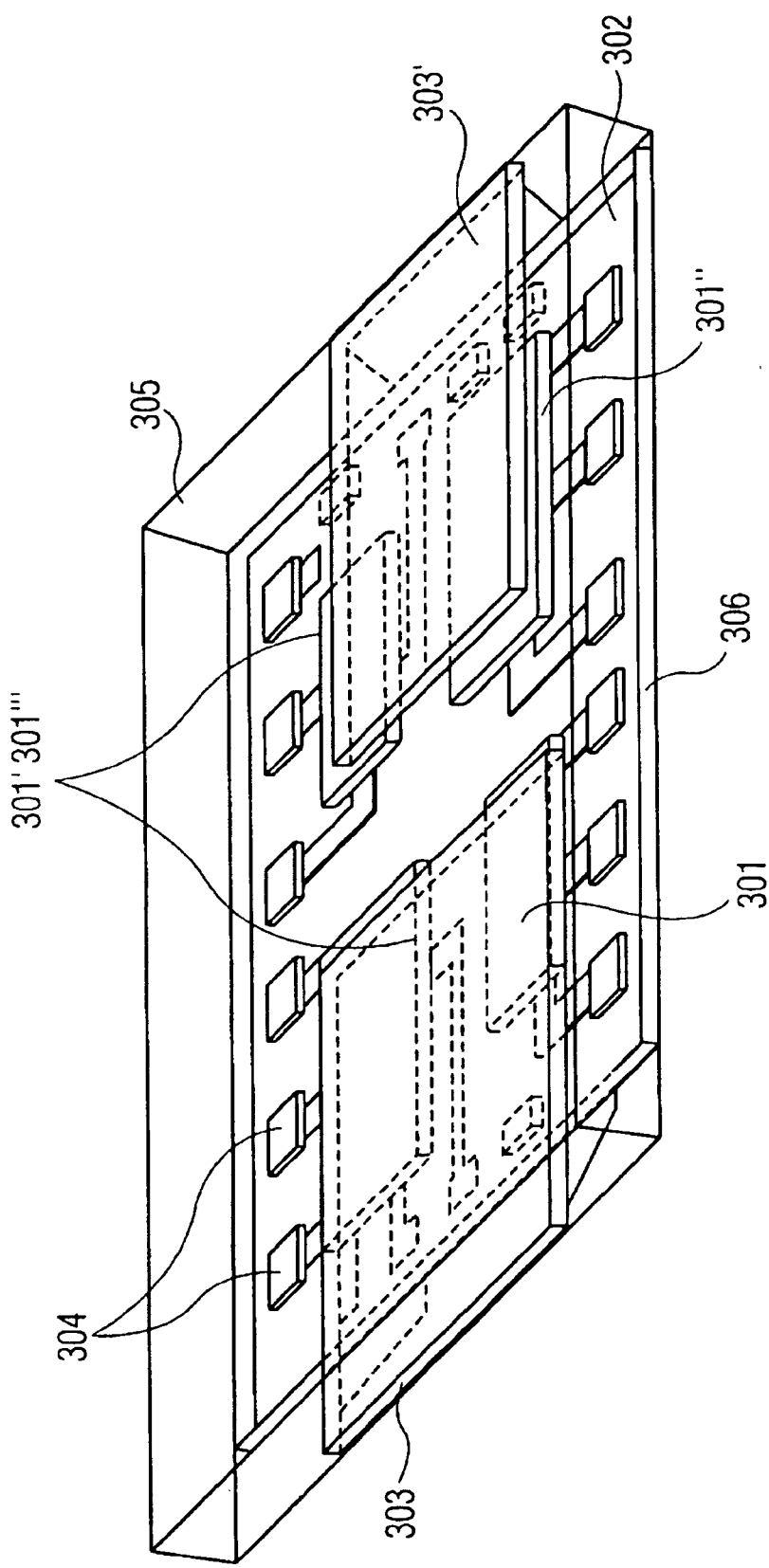
FIG. 3 is an inside view of an embodiment of the present invention.

FIG. 3 is an inside view of an embodiment of a folded flex, bondwire-less multichip power package in accordance with the claimed invention. Devices, including semiconductor power dies and IC dies 301, 301', 301'', 301''' etc. are attached to a main portion 306 of a continuous flex substrate 302. The devices 301, 301', 301'', 301''' etc., on the face of each device die, have device pads (not shown) with flipchip bumps. Extensions 303 and 303' of the flex substrate 302 are folded over, respectively, devices 301 and 301' and devices 301'' and 301'''. The flex substrate is provided with copper contact pads on its bottom surface (not visible in FIG.3) and with connections 304 for board attachment. A molding compound is formed around the package in the shape 305 of an elongated rectangular box.

Flex substrates for semiconductor packaging are laminates which, typically, include layers of solder mask, copper and polymer film, such as the polyimide films sold by E. I duPont de Nemours and Co. under the trademark Kapton®.

Figure 4:
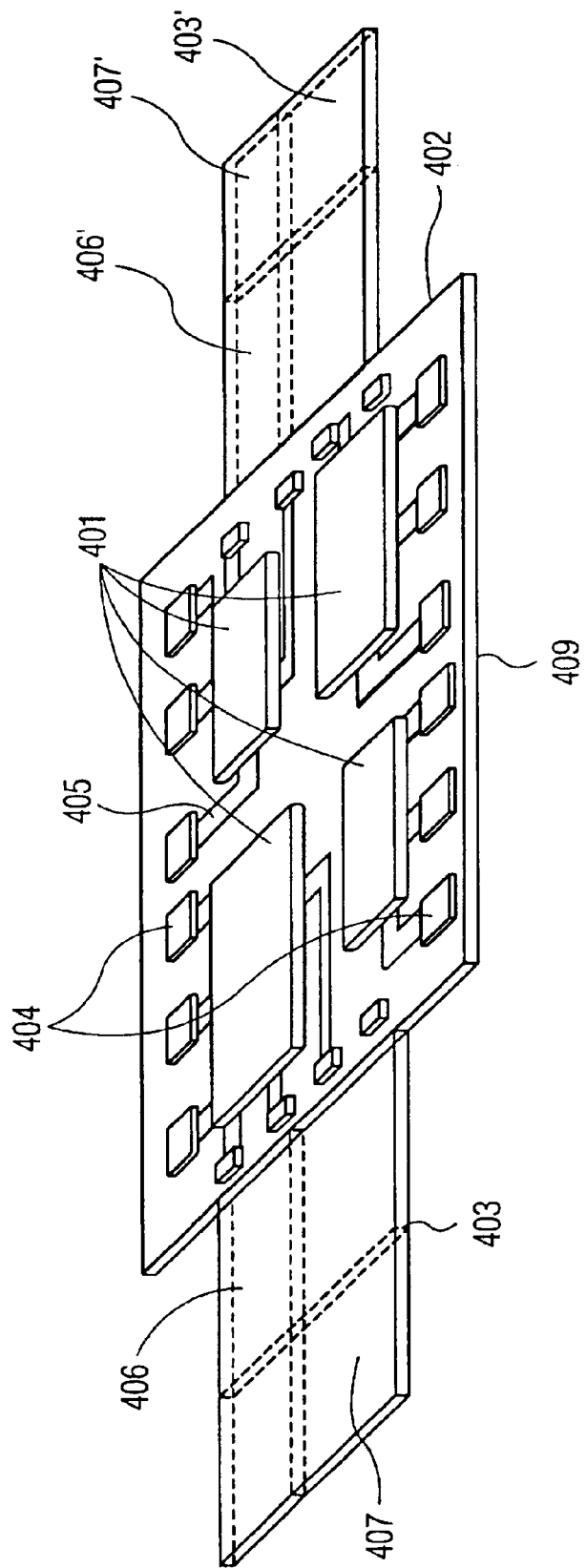
FIG. 4 is a plan view of a face down (flipchip) die attached on a patterned flex substrate.

FIG. 4 is a plan view of a face down (flipchip) die attached on a patterned flex substrate. A patterned flex substrate 402 has connections 404 for board attachment and has extensions 403, 403' for die backside attachment. The extensions 403, 403' have, respectively, first parts 406, 406' and second parts 407, 407'. The first parts 406, 406' each have an edge adjacent and parallel to an edge of a main portion 409 of the patterned flex substrate 402, to which main portion 409 the topsides of the device dies 401 are attached. Each first part 406, 406' is covered by solder mask. The second parts 407, 407' have the copper layer of the substrate 402 at least partially exposed and are contiguous with their respective first parts 406, 406' and extend from the first parts 406, 406' to the ends of the respective extensions 403, 403', which are farthest from the main portion 409 of the patterned flex substrate 402.

Initially, the flipchip bumps (e.g. gold studs) are produced on the device pads on the face of the device dies 401. This preparation is accomplished at the wafer level.

Figure 5:
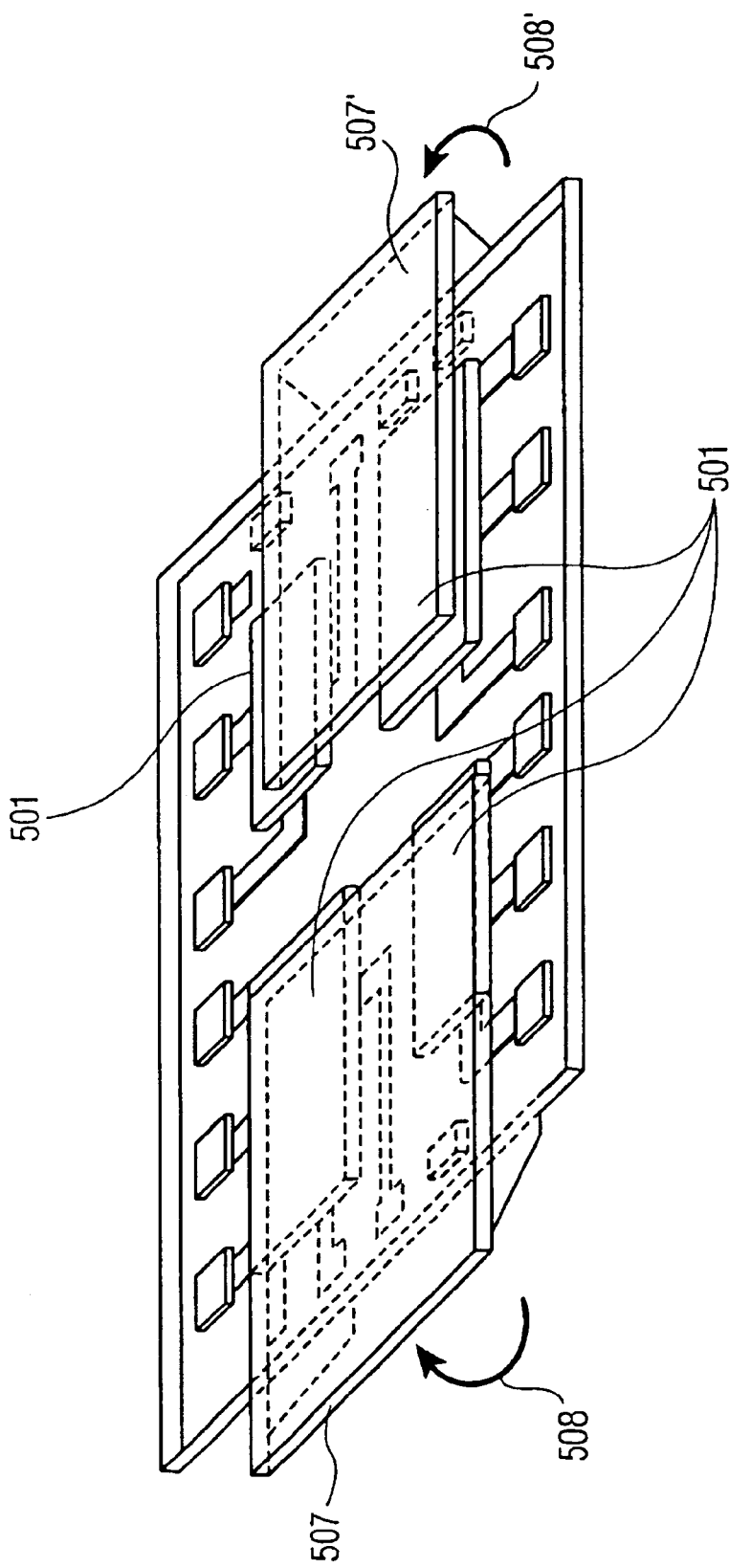
FIG. 5 illustrates folding of the flex-substrate and attachment to the die-backside.

A method of fabricating the packaging structure includes three steps, as can be seen from FIG. 4 and FIG. 5.

The bumped device dies 401 are first attached to the patterned flex substrate 402 as shown in FIG. 4. Thermally conductive epoxy is dispensed on the patterned substrate. Using a pick and place machine, the bumped device dies 401 are then lowered through to the epoxy and placed accurately on the contact pads of the substrate. A thermo-compression process is used to establish physical contacts of the studbumps to the copper pads on the flex substrate. The thermo-compression process also acts as the curing process of the thermally conductive epoxy, thus achieving robust flipchip interconnections with underfilling in just one processing step.

Second, the second parts of the extensions (407, 407' in FIG. 4 and 507, 507' in FIG. 5) of the flex substrate are folded as shown by the arrows 508, 508' in FIG. 5.

Third, the second parts of the extensions (407, 407' in FIG. 4 and 507, 507' in FIG. 5) are attached to the die-backsides 501, using, for example, an epoxy or solder. The patterned traces of the second part of the extended flex substrate keep the backsides 501 of the MOSFET dies and other device dies isolated.

Use in the present invention of a conductive epoxy, such as silver filled epoxy, to attach the extensions 507, 507' to the die-backsides 501 allows a package that does not contain lead.

The structure is then encapsulated with molding compound, covering the entire thickness from the flex substrate to, at least, the surface as shown in FIG. 5. Only the connections on the backside of the flex substrate are exposed for standard SMT board attachment process.

A number of variations on the package implementation are possible. Solder bumps, instead of gold studbumps, can also be used on the devices to achieve device interconnections in the proposed structure. In that case, a solder reflow and an underfilling process may be used to attach the devices to the flex substrate. Nevertheless, solder bumps require depositing solderable metallization (e.g. Ti-Ni-Au/Ag) on the Al contact pads of the devices.

Another example of variation in the package implementation is attaching flexible copper straps to the drain of the individual devices using epoxy or solder, instead of folding the patterned extensions of the substrate. These straps will connect the drain pads of the MOSFET's to their respective contact pads on the flex substrate.

"Comprising" does not exclude other elements or steps. "A" or "an" does not exclude a plurality. A single processor or other unit may fulfill the functions of several means recited in the claims.

What is claimed is:

1. An electronic assembly comprising:
   a package carrier comprising a flexible substrate,
   the substrate comprising at least a copper layer between a polymer layer and a solder mask layer;
   the substrate having a main portion and at least one extension;
   power electronics components, including at least one semiconductor die, the components being mounted on an unfolded surface of the main portion of the substrate,
   the at least one semiconductor die having studbump electrical connections; and
   the at least one extension being folded to extend over part of the substrate, said part including the at least one semiconductor die.

2. The electronic assembly of claim 1, further comprising one or more electrical contact pads, said contact pads being formed of a part of the copper layer, said part being exposed to the exterior of the assembly on a second surface of the main portion of the substrate, said contact pads being the only electrical contacts on the exterior of the assembly.

3. An electronic assembly comprising:
   a package carrier comprising a flexible substrate,
   the substrate comprising at least a copper layer between a polymer layer and a solder mask layer;
   the substrate having a main portion and at least one extension;
   at least one semiconductor die mounted on a surface of the main portion of the substrate,
   the at least one semiconductor die having studbump electrical connections; and
   the at least one extension being folded to extend over part of the substrate, said part including the at least one semiconductor die,
   the thickness of the assembly being less than 0.9 mm.

4. The electronic assembly of claim 3, wherein the thickness of the assembly is 0.6 mm or less.

5. The electronic assembly of claim 1, further comprising one or more electrical contact pads, said contact pads being formed of a part of the copper layer exposed to the exterior of the assembly on a second surface of the main portion of the substrate, the at least one semiconductor die and contact pads being interconnected without wirebonds.

6. The electronic assembly of claim 1, wherein the at least one extension does not extend over all of the main portion of the substrate.

7. The electronic assembly of claim 1 further comprising a second extension, the second extension being folded to extend over a second part of the main portion of the substrate, a second at least one semiconductor die being mounted on said second part.

8. The electronic assembly of claim 7, wherein the at least one extension and second extension do not extend over all of the main portion of the substrate.

9. An electronic assembly comprising: a flexible substrate, having an unfolded main portion and at least one extension,
   the at least one extension having a smaller area than the main portion and comprising a first part and a second part,
   the first part being between the second part and the main portion of the substrate; and
   at least one semiconductor die having a topside and a backside, the topside being opposite the backside and mounted on a surface of the main portion of the substrate,
   the first part being folded, the second part being attached on the surface of the substrate to the backside of the semiconductor die, and the main portion not being folded,
   the semiconductor die being electrically connected to the substrate through a conductive bump on a surface of the semiconductor die.

10. The electronic assembly of claim 9, wherein the at least one semiconductor die is a MOSFET comprising source, gate and drain connections, the source and gate connections being on the topside and the drain connection being on the backside.

11. The electronic assembly of claim 9, wherein the at least one semiconductor die comprises electrical connections, said electrical connections being studbumps.

12. The electronic assembly of claim 9, wherein the substrate comprises at least a copper layer between a polymer layer and a solder mask layer, the substrate further comprising one or more electrical contact pads, said contact pads being formed of a part of the copper layer, said part being exposed to the exterior of the assembly on a second surface of the main portion of the substrate, said surface extending parallel to the topside and said contact pads being the only contact pads on the exterior of the assembly.

13. An electronic assembly comprising:
    a flexible substrate, having a main portion and at least one extension,
    the at least one extension comprising a first part and a second part,
    the first part being between the second part and the main portion of the substrate; and
    at least one semiconductor die having a topside and a backside, the topside being opposite the backside and mounted on a surface of the main portion of the substrate,
    the first part being folded and the second part being attached on the surface of the substrate to the backside of the semiconductor die,
    the thickness of the assembly being less than 0.9 mm.

14. The electronic assembly of claim 13, wherein the thickness of the assembly is 0.6 mm or less.

15. The electronic assembly of claim 9, wherein the substrate comprises at least a copper layer between a polymer layer and a solder mask layer, the substrate comprising one or more electrical contact pads, said contact pads being formed of a part of the copper layer, said part being exposed to the exterior of the assembly on a second surface of the main portion of the substrate, said surface extending parallel to the topside and said contact pads being interconnected without wirebonds.

16. The electronic assembly of claim 9, wherein a leadframe is not provided.

17. A method of assembling an electronic module comprising:

attaching a studbumped device die to an unfolded flex substrate on which one or more other components are of a multichip power conversion device are mounted at a first surface of the studbumped device die;

folding a first extension of the flex substrate to bring a second extension of the flex surface over a second surface of the studbumped device die; and attaching the second extension to the second surface of the studbumped device die.

18. The method of claim 17, wherein the bumped device die comprises gold studbumps.

19. The method of claim 17, further comprising encapsulating the module in molding compound.

* * * * *